United States Patent
Sinta et al.

[11] Patent Number: 5,886,102
[45] Date of Patent: Mar. 23, 1999

[54] ANTIREFLECTIVE COATING COMPOSITIONS

[75] Inventors: Roger F. Sinta, Woburn; Timothy G. Adams, Sudbury; James Michael Mori, Dorchester, all of Mass.

[73] Assignee: Shipley Company, L.L.C., Marlborough, Mass.

[21] Appl. No.: 665,019

[22] Filed: Jun. 11, 1996

[51] Int. Cl.$^6$ .............. G03F 7/11; C08L 33/08; C08L 33/10; C08L 33/04
[52] U.S. Cl. .......... 525/154; 525/154; 525/330.3; 525/330.4; 525/330.5; 525/330.6; 430/271.1
[58] Field of Search ................... 525/154, 106, 525/130, 185, 194, 330.3, 330.4, 330.5, 330.6; 430/271.1

[56] References Cited

U.S. PATENT DOCUMENTS

| | | | |
|---|---|---|---|
| 4,060,656 | 11/1977 | Naka et al. | 428/355 |
| 4,362,809 | 12/1982 | Chen et al. | 430/312 |
| 4,370,405 | 1/1983 | O'Toole et al. | 430/311 |
| 4,576,898 | 3/1986 | Hoffman et al. | 430/306.9 R |
| 4,910,122 | 3/1990 | Arnold et al. | 430/313 |
| 5,693,691 | 12/1997 | Flaim et al. | 430/271.1 |

FOREIGN PATENT DOCUMENTS

| | | | |
|---|---|---|---|
| 0 542 008 A1 | 5/1993 | European Pat. Off. | |
| 0698823A1 | 2/1996 | European Pat. Off. | 430/271.1 |
| WO 90/03598 | 4/1990 | WIPO. | |
| WO 93/22901 | 11/1993 | WIPO. | |

*Primary Examiner*—Cynthia Hamilton
*Attorney, Agent, or Firm*—Robert L. Goldberg

[57] ABSTRACT

The invention provides new light absorbing crosslinking compositions suitable for use as an antireflective composition (ARC), particularly for deep UV applications. The ARCs of the invention in general comprise a crosslinker and novel ARC resin binders that effectively absorb reflected deep UV exposure radiation.

9 Claims, No Drawings

ANTIREFLECTIVE COATING COMPOSITIONS

BACKGROUND OF THE INVENTION

1. Field of the Invention

The present invention relates to compositions that reduce reflection of exposing radiation from a substrate back into an overcoated photoresist layer. More particularly, the invention relates to antireflective coating compositions that contain a resin binder components that effectively absorbs deep UV exposure radiation.

2. Background Art

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are known to the art and described by Deforest, *Photoresist Materials and Processes*, McGraw Hill Book Company, New York, ch. 2, 1975 and by Moreay, *Semiconductor Lithography, Principles, Practices and Materials*, Plenum Press, New York, ch. 2 and 4, both incorporated herein by reference for their teaching of photoresist compositions and methods of making and using the same.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the more important steps in attaining high resolution photoresist images.

Reflection of activating radiation used to expose a photoresist often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect". To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile. The time required to expose the photoresist is generally an increasing function of photoresist thickness because of the increased total amount of radiation required to expose an increased amount of photoresist. However, because of the standing wave effect, the time of exposure also includes a harmonic component which varies between successive maximum and minimum values with the photoresist thickness. If the photoresist thickness is non-uniform, the problem becomes more severe, resulting in variable linewidths.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical. For example, metal interconnects used on many microelectronic substrates are particularly problematic due to their topography and regions of high reflectivity.

With recent trends towards high-density semiconductor devices, there is a movement in the industry to shorten the wavelength of exposure sources to deep ultraviolet (DUV) light (300 nm or less in wavelength), KrF excimer laser light (248.4 nm), ArF excimer laser light (193 nm), electron beams and soft x-rays. The use of shortened wavelengths of light for imaging a photoresist coating has generally resulted in increased reflection from the upper resist surface as well as the surface of the underlying substrate. Thus, the use of the shorter wavelengths has exacerbated the problems of reflection from a substrate surface.

Another approach used to reduce the problem of reflected radiation has been the use of a radiation absorbing layer interposed between the substrate surface and the photoresist coating layer. See, for example, PCT Application WO 90/03598, EPO Application No. 0 639 941 A1 and U.S. Pat. Nos. 4,910,122, 4,370,405 and 4,362,809, all incorporated herein by reference for their teaching of antireflective (antihalation) compositions and the use of the same. Such layers have also been referred to in the literature as antireflective layers or ARCs (antireflective compositions).

The ARC of the above cited European Application 639 941 A1 comprises a compound having one or more glycidyl groups in the molecule, at least one anthracene derivative derivatized so as to cross-link with the compound having one or more glycidyl groups and a solvent. In use, an antireflective coating is coated onto a substrate and cured whereby the derivatized anthracene acts as a cross-linking agent with the compound having the glycidyl substitution. That disclosed ARC can exhibit certain disadvantages, particularly with respect to stability or consistency. Specifically, compounds having glycidyl substitution are relatively reactive, e.g., the glycidyl groups may react with each other or with the derivatized anthracene. This can result in a change in viscosity of the ARC coating solution during storage which will alter coating characteristics. In use, the described ARCs are coated onto a substrate and then cured to induce crosslinking between the derivatized anthracene and the glycidyl groups of the glycidyl containing compound. Cure conditions include heating to a temperature of from 150° to 230° C. for up to 30 minutes. At these temperatures, the derivatized anthracene may evaporate or sublime from the coating together with the solvents for the coating composition. Since the anthracene derivative is both a chromophore and a crosslinking agent, a reduction in its concentration in the ARC can lead to unpredictable absorption characteristics and unpredictable dissolution properties.

In Shipley Company's European Application 542 008 A1 highly useful antihalation (antireflective) compositions are disclosed that comprise a resin binder and a crosslinker compound.

While it has been found that prior ARC compositions may be effective for many antireflective applications, prior compositions also may pose some potential performance limitations, e.g. when the antireflective compositions are used with resist compositions to pattern features of submicron or sub-half micron dimensions. In particular, use of at least some prior antireflective compositions has resulted in undercutting of a developed resist relief image, known in the art as "notching". Another problem has been "footing", i.e. the failure to clear during development that results in an upwardly tapering relief image sidewall. Both notching and footing can compromise the resolution of the image patterned onto the underlying substrate.

It thus would be desirable to have new antireflective coating compositions.

SUMMARY OF THE INVENTION

The present invention provides new light absorbing crosslinking compositions suitable for use as an ARC, particularly for deep UV applications. The ARCs of the invention in general comprise a crosslinker and a resin binder that effectively absorbs deep Uw exposure radiation to reduce reflections of same.

Resin binders of ARCs of the invention contain one or more moieties that are chromophores for the exposure radiation of an overcoated resist composition, i.e. the moieties are capable of absorbing exposure radiation to thereby reduce reflections. For example, for preferred antireflective compositions used with a deep UV (DUV) photoresist, preferred chromophores include anthracenyl, particularly alkylene anthracene esters such as pendant groups of the formula —(C=O)O(CH$_2$)$_n$ anthracene, wherein n is an integer from 1 to about 6. Other preferred chromophores include quinolinyl and ring-substituted quinolinyl derivatives such as hydroxyquinolinyl, phenanthrenyl and acridine groups. Suitably about 5 to 90 percent of the units of a resin comprise such a chromophore, more preferably about 10 to 80 percent. Preferred resin binders of the invention have an optical density of at least about 4 units/$\mu$ at 248 nm. Preferred resin binders also are capable of reaction with the crosslinker component, e.g. by a hydroxy or carboxy moiety on the resin or a "masked" moiety such as an ester that can generate such a reactive group in the presence of acid or otherwise.

The antireflective composition resin binder with chromophore moieties suitably is a copolymer and is prepared by polymerizing two or more different monomers where at least one of the monomers includes a chromophore group. It has been found that this synthesis provides distinct advantages over finctionalization of a preformed polymer to add chromophore groups. For example, the synthesis of the invention avoids further reaction steps of grafting the chromophore units onto a preformed polymer as well as one or more subsequent purification steps. The synthesis also permits precise tailoring of the composition of the formed resin.

Also, the synthesis of the invention enables good control of the quantity of chromophore units on a polymer. In contrast, grafting of chromophore units onto a preformed resin often provides a resin mixture of polymers with varying percentages of chromophore. Such differing quantities of chromophores unit can compromise resolution of an image patterned into an overcoated photoresist layer as the chromophore differences may result in essentially random reflections of exposure radiation. The synthesis of the invention also enables preparation of a greater variety of types of polymers. Grafting chromophore units onto at least some types of preformed polymers may be quite difficult, or simply not possible, particularly in larger scale productions. For example, it can be particularly difficult to drive the reaction to completion resulting in undesired products which must be removed from desired materials.

The invention further provides methods for forming a relief image and novel articles of manufacture comprising substrates coated with an ARC composition of the invention alone or in combination with a photoresist composition. Other aspects of the invention are disclosed infra.

DETAILED DESCRIPTION OF THE INVENTION

The resin binder component of the antireflective compositions of the invention are preferably used with deep UV imaging systems and will effectively absorb reflections in the deep UV range (typically from about 100 to 300 nm). Thus, the resin binder preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophores, e.g. groups having from two to three or four fussed or separate rings with 3 to 8 ring members in each ring and zero to three N, O or S atoms per ring. Such chromophores include substituted and unsubstituted phenanthryl, substituted and unsubstituted anthracyl, substituted and unsubstituted acridine, substituted and unsubstituted naphthyl, substituted and unsubstituted quinolinyl and ring-substituted quinolinyls such as hydroxyquinolinyl groups. Substituted or unsubstituted anthracyl groups are particularly preferred. For example, preferred resin binders have pendant anthracyl groups, particularly acrylic resins of the following Formula (I):

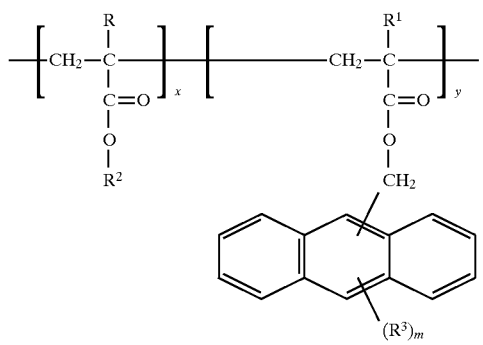

wherein each R and $R^1$ is independently a hydrogen or a substituted or unsubstituted alkyl group having from 1 to about 8 carbon atoms, preferably substituted or unsubstituted $C_{1-6}$ alkyl;

each $R^2$ is independently substituted or unsubstituted alkyl having 1 to about 10 carbon atoms, more typically 1 to about 6 carbons;

each $R^3$ may be independently halogen (particularly F, Cl and Br), alkyl having 1 to about 8 carbon atoms, alkoxy having 1 to about 8 carbon atoms, alkenyl having 2 to about 8 carbon atoms, alkynyl having 2 to about 8 carbon atoms, cyano, nitro, etc.;

m is an integer of from 0 (where the anthracyl ring is fully hydrogen-substituted) to 9, and preferably m is 0, 1 or 2;

x is the mole fraction or percent of alkyl acrylate units in the polymer and preferably is from about 10 to about 80 percent; and y is the mole fraction or percent of anthracene units in the polymer and preferably is from about 5 to 10 to 90 percent. The polymer also may contain other units if desired, but preferably the polymer will contain at least about 10 mole percent of anthracene units. Hydroxyalkyl is a particularly preferred $R^2$ group, especially alkyl having a primary hydroxy group such as where $R^2$ is 2-hydroxyethylene (—$CH_2CH_2OH$). Preferably the resin binder contains 9-(methylene)anthracene ester units.

Another preferred resin binder comprises substituted or unsubstituted quinolinyl or a quinolinyl derivative that has one or more N, O or S ring atoms such as a hydroxyquinolinyl. The polymer may contain other units such as carboxy and/or alkyl ester units pendant from the polymer backbone. A particularly preferred ARC resin binder is an acrylic polymer of the following Formula (II):

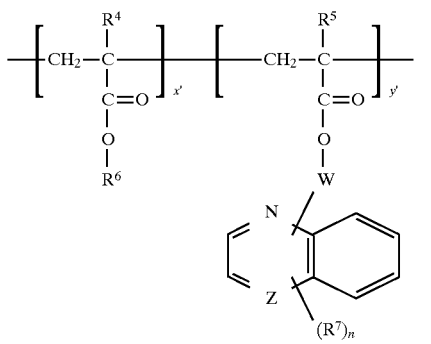

wherein each $R^4$ and $R^5$ is independently a hydrogen or a substituted or unsubstituted alkyl group having from 1 to about 8 carbon atoms, preferably substituted or unsubstituted $C_{1-6}$ alkyl;

each $R^6$ is independently substituted or unsubstituted alkyl having 1 to about 10 carbon atoms, more typically 1 to about 6 carbons;

W is a bond or substituted or unsubstituted alkylene having 1 to about 4 carbons, and preferably is a bond;

Z is a carbon, nitrogen, oxygen or sulfur;

each $R^7$ may be independently halogen (particularly F, Cl and Br), alkyl having 1 to about 8 carbon atoms, alkoxy having 1 to about 8 carbon atoms, alkenyl having 2 to about 8 carbon atoms, alkynyl having 2 to about 8 carbon atoms, cyano, nitro, etc.;

n is an integer of from 0 (where the ring is fully hydrogen-substituted) to 7, and preferably n is 0, 1 or 2.

x' is the mole fraction or percent of alkyl acrylate units in the polymer and preferably is from 10 to about 80 percent; and y' is the mole fraction or percent of quinolinyl or hydroxyquinolinyl units in the polymer and preferably is from about 5 to about 90 percent. The polymer also may contain other units if desired, but preferably the polymer will contain at least about 10 mole percent of quinolinyl and/or hydroxyquinolinyl units. Hydroxyalkyl is a particularly preferred $R^6$ group, especially alkyl having a primary hydroxy group such as where $R^6$ is 2-hydroxyethylene.

The above-mentioned substituted groups (i.e. substituted groups $R^1$ through $R^7$ and W) may be substituted at one or more available positions by one or more suitable groups such as e.g. halogen (particularly F, Cl and Br); cyano; hydroxyl, nitro, alkanoyl such as a $C_{1-6}$ alkanoyl group such as acyl and the like; alkyl groups having from 1 to about 8 carbon atoms; alkenyl and alkynyl groups having one or more unsaturated linkages and 2 to about 8 carbon atoms; alkoxy groups having from 1 to about 6 carbons; etc.

As discussed above, the ARC resin binders are preferably synthesized by polymerizing two or more different monomers where at least one of the monomers includes a chromophore group, e.g. an anthracenyl, quinolinyl or hydroxyquinolinyl group. A free radical polymerization is suitably employed, e.g., by reaction of a plurality of monomers to provide the various units in the presence of a radical initiator preferably under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). See the examples which follow for exemplary reaction conditions. Suitable reaction temperatures for any particular system can be readily determined empirically by those skilled in the art based on the present disclosure. A reaction solvent may be employed if desired. Suitable solvents include alcohols such as propanols and butanols and aromatic solvents such as benzene, chlorobenzene, toluene and xylene. Dimethylsulfoxide, dimethylformamide and THF are also suitable. The polymerization reaction also may be run neat. A variety of free radical initiators may be employed to prepare the copolymers of the invention. For example, azo compounds may be employed such as azo-bis-2,2'-isobutyronitrile (AIBN) and 1,1'-azobis(cyclohexanecarbonitrile). Peroxides, peresters, peracids and persulfates also can be employed.

Also, while less preferred, a preformed resin may be functionalized with chromophore units. For example, a glycidyl phenolic resin such as a glycidyl novolac can be reacted with an anthranyl carboxylic acid.

Preferably the ARC resin binder will have a weight average molecular weight (Mw) of about 1,000 to about 10,000,000 daltons, more typically about 5,000 to about 1,000,000 daltons, and a molecular number molecular weight (Mn) of about 500 to about 1,000,000 daltons. Molecular weights (either Mw or Mn) of the polymers of the invention are suitably determined by gel permeation chromatography.

Resin binders of the invention preferably exhibit good absorbance at deep UV wavelengths such as within the range of from 100 to about 300 nm. More specifically, preferred resin binders of the invention have optical densities of at least about 3 absorbance units per micron (Absorb. units/μ) at about 248 nm, preferably from about 5 to 20 or more absorbance units per micron at 248 nm, more preferably from about 8 to 16 or more absorbance units per micron at 248 nm. Higher absorbance values for a particular resin can be obtained by increasing the percentage of chromophore units on the resin.

The antireflective compositions of the invention also may contain resins that do not include polycyclic chromophore units as a co-resin present with resins having polycyclic chromophore units, or as the sole resin of the ARC binder component. For example, phenolic resins such as the poly (vinylphenols), novolaks and other resins described below as photoresist resin binders could be employed in resin binder components of ARCs of the invention.

The concentration of the resin binder component of the antireflective compositions of the invention may vary within relatively broad ranges, and in general the resin binder is employed in a concentration of from about 50 to 95 weight percent of the total of the dry components of the ARC, more typically from about 60 to 90 weight percent of the total dry components (all components except solvent carrier).

ARCs of the invention also contain a crosslinker component. A variety of crosslinkers may be employed, including those ARC crosslinkers disclosed in the above-mentioned Shipley European Application 542008.

Low basicity crosslinkers are particularly preferred such as a methoxy methylated glycouril. A specifically preferred crosslinker is a methoxy methylated glycouril corresponding to the following structure (III):

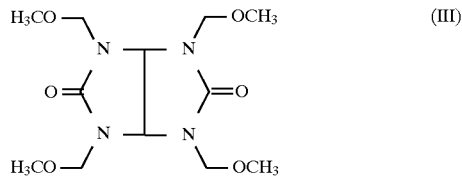

(III)

This methoxy methylated glycouril can be prepared by known procedures. The compound is also commercially available under the tradename of Powderlink 1174 from the American Cyanamid Co.

Other suitable low basicity crosslinkers include hydroxy compounds, particularly polyfunctional compounds such as phenyl or other aromatics having one or more hydroxy or hydroxy alkyl substituents such as a $C_{1-8}$ hydroxyalkyl substituents. Phenol compounds are generally preferred such as di-methanolphenol ($C_6H_3(CH_2OH)_2OH$) and other compounds having adjacent (within 1–2 ring atoms) hydroxy and hydroxyalkyl substitution, particularly phenyl or other aromatic compounds having one or more methanol or other hydroxylalkyl ring substituent and at least one hydroxy adjacent such hydroxyalkyl substituent.

It has been found that a low basicity crosslinker such as a methoxy methylated glycouril used in antireflective compositions of the invention can provide excellent lithographic performance properties, including the substantial reduction or even elimination (SEM examination) of undercutting or footing of an overcoated photoresist relief image.

The antireflective compositions of the invention preferably further comprise an acid or acid generator compound for catalyzing or promoting reaction of the glycouril compound during curing of an ARC coating layer. Preferably an acid generator compound is employed that liberates acid upon photolysis or thermal treatment. Preferably a thermal acid generator is employed, i.e. a compound that generates acid upon thermal treatment. A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Typically a thermal acid generator is present in an antireflective composition in concentration of from about 0.5 to 15 percent by weight of the total of the dry components of the composition, more preferably about 2 percent by weight of the total dry components. Photoacid generators also may be employed in an antireflective composition, for example onium salts, halogenated non-ionic photoacid generators such as 1,1-bis [p-chlorophenyl]-2,2,2-trichloroethane, and other photoacid generators disclosed herein for use in photoresist compositions. Suitable amounts of a photoacid generator in an antireflective composition in general range from about 1 to 15 percent by weight of the total of dry components of the composition. For an antireflective composition containing a photoacid generator, a coating layer of the composition is exposed to an effective amount of activating radiation to generate the photoacid, followed by a post-exposure bake at a temperature sufficient to cure the coating layer. However, in generally preferred embodiments of the invention an antireflective composition is completely or at least essentially free (e.g., less than about 1 weight percent based on total dry components weights) of a photoacid generator, and an acid or thermal acid generator is used as an acid source and the ARC is cured thermally without an exposure step.

Also, as discussed above, rather than an acid generator, an acid may be simply formulated into the ARC, particularly for ARCs that require heating to cure in the presence of acid so that the acid does not promote undesired reaction of composition components prior to use of the ARC. Suitable acids include e.g. strong acids such as sulfonic acids such as toluene sulfonic acid and sulfonic acid, triflic acid, or mixtures of those materials.

Antireflective compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 available from the 3M Company.

To make a liquid coating composition, the components of the antireflective composition are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antireflective composition varies from about 0.5 to 20 weight percent of the total weight of the antireflective composition, preferably the solids content varies from about 2 to 10 weight percent of the total weight of the antireflective composition.

A variety of photoresist compositions can be employed with the antireflective compositions of the invention, including positive-acting and negative-acting photoacid-generating compositions. Photoresists of the invention typically comprise a resin binder and a photoactive component, typically a photoacid generator compound. Preferably the photoresist resin binder has finctional groups that impart alkaline aqueous developability to the images resist composition. Preferred are resin binders that comprise polar functional groups such as hydroxyl or carboxylate and the resin binder is used in a resist composition in an amount sufficient to render the resist developable with an aqueous alkaline solution.

Generally preferred resist resin binders are phenolic resins including phenol aldehyde condensates known in the art as novolak resins, homo and copolymers or alkenyl phenols and homo and copolymers of N-hydroxyphenyl-maleimides.

Examples of suitable phenols for condensation with a aldehyde, especially formaldehyde, for the formation of novolak resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight (Mw) from about 500 to 100,000 daltons. Poly(vinylphenols) may be prepared, e.g., as disclosed in U.S. Pat. No. 4,439,516. Preferred resin binders and the preparation thereof are also disclosed in U.S. Pat. No. 5,128,230.

Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols also may be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight (Mw) range of from about 2,000 to about 60,000 daltons.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Further preferred resin binders include resins formed from bishydroxymethylated compounds, and block novolak resins. See U.S. Pat. Nos. 5,130,410 and 5,128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

One suitable class of photoresists for use with ARCs of the invention are "conventional" positive-acting resists that comprise a photoacid generator and a resin binder component such as a novolak or poly(vinylphenol) or partially hydrogenated derivative thereof and wherein the photoactive component serves as a dissolution rate inhibitor. Photoactivation of a coating layer of the resist results in conversion of the photoactive component to an acidic material, rendering regions of the coating layer containing this acidic photoproduct comparatively more soluble in an aqueous alkaline developer solution than regions that contain only the intact (non-activated) photoactive component. The photoactive component typically used in these positive resists are quinone diazides such as 2,1,4-diazonaphthoquinone sulfonic acid esters and 2,1,5-diazonaphthoquinone sulfonic acid esters.

In particularly preferred aspects of the invention, the ARCs of the invention are used with chemically amplified positive-acting resist compositions. A number of such resist compositions have been described, e.g., in U.S. Pat. Nos. 4,968,581; 4,883,740; 4,810,613 and 4,491,628, all of which are incorporated herein by reference for their teaching of making and using chemically amplified positive-acting resists. A particularly preferred chemically amplified photoresist for use with an ARC of the invention comprises in admixture a photoacid generator and a resin binder that comprises a copolymer containing both phenolic and non-phenolic units. For example, one preferred group of such copolymers has acid labile groups substantially, essentially or completely only on non-phenolic units of the copolymer. One especially preferred copolymer binder has repeating units x and y of the following formula:

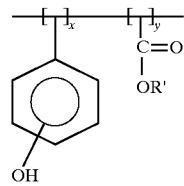

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less. Additional preferred chemically-amplified positive resists are disclosed in U.S. Pat. No. 5,258,257 to Sinta et al.

Preferred negative-acting resist compositions for use with an ARC of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172, Powderlink 1174, urea-based resins are sold under the trade names of Beetle 60, 65 and 80, and benzoguanamine resins are sold under the trade names Cymel 1123 and 1125.

Suitable photoacid generator compounds of resists used with ARCs of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Photoresists for use with an ARC of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

ARCs of the invention that include a low basicity crosslinker such as a suitable glycouril are particularly useful with photoresists that generate a strong acid photoproduct upon exposure such as triflic acid, camphor sulfonate or other sulfonic acid, or other acid having a pKa (25° C.) of about 2 or less. Without wishing to be bound by theory, it is believed ARCs of the invention are particularly effective with such strong acid resists because the strong photogenerated acid will migrate from the resist and remain in the ARC layer to a lesser extent relative to a comparable ARC that contain a more basic crosslinker. That is, the low basicity crosslinkers of the invention will tie up strong photogenerated acids of an overcoated resist layer to a lesser extent than a more basic ARC crosslinker. As a result thereof, less acid loss from the resist layer will occur and resolution problems such as footing will be reduced.

In use, an antireflective composition of the invention is applied as a coating layer to a substrate may any of a variety of methods such as spin coating. The antireflective composition in general is applied on a substrate with a dried layer thickness of between about 0.02 and 0.5 $\mu$m, preferably a dried layer thickness of 5 between about 0.04 and 0.20 $\mu$m. The substrate is suitably any substrate conventionally used in processes involving photoresists. For example, the substrate can be silicon, silicon dioxide or aluminum-aluminum oxide microelectronic wafers. Gallium arsenide, ceramic, quartz or copper substrates may also be employed. Substrates used for liquid crystal display or other flat panel display applications are also suitably employed, for example glass substrates, indium tin oxide coated substrates and the like.

Preferably the antireflective layer is cured before a photoresist composition is applied over the ARC. Cure conditions will vary with the components of the ARC. Thus, if the composition does not contain an acid or acid generator, cure temperatures and conditions will be more vigorous than those of a composition containing an acid or acid generator compound. Typical cure conditions are from about 120° C. to 225° C. for about 0.5 to 40 minutes. Cure conditions preferably render the ARC coating layer substantially insoluble to the photoresist solvent as well as an alkaline aqueous developer solution. Additionally, as discussed above, if the ARC includes a photoacid generator, the composition coating layer can be at least partially cured by exposing the coating layer to an effective amount of activating radiation (e.g., between about 10 to 300 mJ/cm$^2$), followed by a post-exposure bake of from 50° to 225° C.

After such curing a photoresist is applied over the surface of the ARC. As with application of the ARC, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the ARC layer and photoresist layer should occur.

The resist layer is then imaged with activating radiation through a mask in conventional manner. The exposure energy is sufficient to effectively activate the photoactive component of the resist system to produce a patterned image in the resist coating layer, more specifically, the exposure energy typically ranges from about 3 to 300 mJ/cm$^2$ depending upon the exposure tool. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to 160° C.

The exposed resist coating layer is then developed, preferably with an aqueous based developer such as an inorganic alkali exemplified by tetrabutyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° to 150° C. for several minutes to further cure the developed exposed coating layer areas.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. A plasma gas etch removes the crosslinked antihalation coating layer.

All documents mentioned herein are incorporated herein by reference.

The following non-limiting examples are illustrative of the invention.

EXAMPLES 1–6

Preparation of preferred ARC resin binders.
1. Preparation of monomers with chromophores.
   A. Preparation of chloroxine methacrylate.

A 500 ml round bottom flask equipped with magnetic stirrer and nitrogen inlet was charged with 5.0 g (0.0234 mol) 5.7 dichloro-8-hydroxyquinoline (chloroxine), 2.01 (0.0234 mol) methacrylic acid, 500 ml methylene chloride, 1.43 g (0.5 eq.), 4-dimethylamino-pyridine (DMAP) and 6.72 g 1-(3-dimethylamino propyl)-3-ethylcarbodimide (EDCI). The reaction mixture was stirred under a blanket of nitrogen for 12 hours at 25° C. The product was purified by column chromatography (methylene chloride) to give a pale yellow solid (yield 67%).

B. Preparation of methylanthracene methacrylate.

Methylanthracene methacrylate ($CH_3C(=CH_2)CO_2CH_2$-9-anthracene) was prepared as disclosed in *Macromolecules*, 17(2):235 (1984).

2. Preparation of resins.

Hydroxyethyl methacrylate (HEMA)/methylanthracene methacrylate (ANTMA) copolymer (Formula II above) was prepared as follows.

A 300 ml 3N round bottom flask equipped with magnetic stirrer, condenser, nitrogen and vacuum inlet was charged with 16.0 g (0.1229 mol) HEMA (purified by distillation), 8.49 g (0.0307 mol) methylanthracene methacrylate, 0.2449 g (1 wt. %) AIBN and 180 ml THF. The reaction flask was quenched in liquid nitrogen while being purged with nitrogen. When the contents of the reaction flask were frozen, the flask was evacuated, then purged with nitrogen (3 times). The reaction mixture was stirred under reflux for 18 hours. The pale yellow polymer was precipitated into 3000 ml ether, filtered, then dried at 50° C. under vacuum (yield 86%) to provide the HEMA/ANTMA copolymer having 81 mole percent of —$CH_2C(CH_3)(CO_2CH_2CH_2OH)$— units and 19 mole percent of —$CH_2C(CH_3)(CO_2CH_2$-9-anthracene) units, a Mn of 2295, Mw of 19150 and a Tg of 101° C.

Additional HEMA/ANTMA copolymers and HEMA/chloroxine methacrylate copolymers (resins of Examples 2–6) were prepared by similar procedures, with the substitution of chloroxine methacrylate for methylanthracene methacrylate in the case of preparation of HEMA/chloroxine methacrylate copolymers.

EXAMPLES 7–14

Preparation and use of ARCs of the invention.

EXAMPLE 7

A preferred antireflective composition of the invention was prepared by mixing the components set forth below, with component amounts expressed as parts by weight based on total weight of the liquid antireflective coating composition:

1) Resin binder: 2.33% Polymer (novolac resin base with approximately 4% glycidyl groups replacing OH, and approximately 80% of OH groups replaced by —$O(C=O)CH_2$9-anthracene)
2) Crosslinker: 0.61% Powderlink 1174 (American Cyanamid)
3) Acid: 0.06% p-toluene sulfonic acid
4) Solvent: 18% ethyl lactate; 10% cyclohexanone; and 68.97% propylene glycol monomethyl ether The antireflective composition was spin coated onto a single crystal silicon substrate 100 mm in diameter at 3100 rpm, and baked on a vacuum hot plate at 205° C. for 60 seconds. The resulting thickness was 600 angstroms. Over this ARC layer a commercially available DUV negative photoresist (sold under the tradename of CGR248 and available from IBM) was applied to a thickness of 8900 Å after a vacuum hot plate bake at 95° C. for 60 seconds. The overcoated resist layer was exposed to KrF excimer radiation (248nm) with an ISI XLS projection stepper through a mask patterned with small lines and spaces with a dose of 9 mJ/cm². The wafer was then baked on a vacuum hot plate at 95° C. for 60 seconds, and then developed with MF702 developer (Shipley Co.; alkaline aqueous solution) for 40 seconds. Resist footing was measured by cross-section SEMs for both isolated and dense lines 0.27 µm wide and averaged 12 nm.

EXAMPLE 8

A further preferred antireflective composition of the invention was prepared by mixing the components set forth below, with component amounts expressed as parts by weight based on total solids (all components except solvent) of the antireflective coating composition:

1) Resin binder: 2.33% Polymer (novolac resin base with ~4% glycidyl groups replacing OH, and ~80% of OH groups replaced by —$O(C=O)CH_2$9-anthracene)
2) Crosslinker: 0.61% Powderlink 1174 (American Cyanamid)
3) Acid: 0.06% p-toluene sulfonic acid
4) Surfactant: 0.03% FC 171 (3M Co.)
5) Solvent: 18% ethyl lactate; 10% cyclohexanone; and 68.97% propylene glycol monomethyl ether This antireflective composition was spin coated onto a single crystal silicon substrate 100 mm in diameter, and baked on a vacuum hot plate at 205° C. for 60 seconds. The resulting thickness was 600 Å. Over this ARC layer a coating layer of a DUV negative photoresist was applied. The resist contained (amounts expressed in weight percents): 88.34% 12% mesylated poly(vinylphenol) (Mw= 5000); 2.65% triarylsulfonium triflate; 8.83% Powderlink 1174; 0.177% tetrabutylammonium hydroxide; 0.2% Silwet 7604; and solvent of ethyl lactate to a thickness of 7575 Å after a vacuum hot plate bake at 90° C. for 60 seconds. Preparation of mesylated poly(vinylphenol) is described in U.S. Pat. No. 5,514,520 issued on May 7, 1996. The overcoated resist was exposed to KrF excimer radiation (248 nm) with an ISI XLS projection stepper through a mask patterned with small lines and spaces with a dose of 17.9 mJ/cm₂. The wafer was then baked on a vacuum hot plate at 130° C. for 60 seconds, and then developed with CD26 (Shipley) developer for 35 seconds. Resist footing was measured by cross-section SEMs for both isolated and dense lines 0.25 um wide and averaged 6 nm.

EXAMPLE 9

A further preferred antireflective composition of the invention was prepared by mixing the components set forth below, with component amounts expressed as parts by weight based on total weight of the liquid antireflective coating composition:
1) Resin binder: 2.62% copolymer of 9-anthrylmethylmethacrylate (26mol %) and 2-hydroxyethylmethacrylate (74 mol %)
2) Crosslinker: 0.36% Powderlink 1174 (American Cyanamid)
3) Thermal Acid Crosslinker: 0.02% 2-nitrobenzyltosylate
4) Surfactant: 0.003% FC431 (fluorinated alkyl ester available from 3M Co.)
5) Solvent: 96% propylene glycol monomethyl ether; 1.0% cyclohexanone This antireflective composition was spincoated onto a single crystal silicon substrate 100 mm in diameter, and baked on a vacuum hot plate at 150° C. for 60 seconds. The resulting coating layer thickness of the ARC was 740 Å. Over this ARC a commercially available DUV positive photoresist (sold under the tradename UVIIHS and available from the Shipley Co.) was applied to a thickness of 8900 Å after a vacuum hot plate bake at 140° C. for 60 seconds. It was exposed to KrF excimer radiation (248 nm) with an ISI XLS projection stepper through a mask patterned with small lines and spaces with a dose of 11.0 mJ/cm$_2$. The wafer was then baked on a vacuum hot plate at 135° C. for 90 seconds, and then developed with CD26 (Shipley) developer for 50 seconds. Resist footing was measured by cross section SEMs for both isolated and dense lines.

EXAMPLE 10

A further preferred antireflective composition was prepared by mixing the following components, with component amounts expressed as parts by weight based on total weight of the liquid antireflective composition:
1) Resin binder: 3.88% Polymer (novolac resin base with ~4% glycidyl groups replacing OH, and ~80% of OH groups replaced by —O(C=O)CH$_2$-9-anthracene+~10% residual 9-anthracene carboxylic acid)
2) Crosslinker: 1.02% Powderlink 1174 (American Cyanamid)
3) Acid: 0.10% p-toluene sulfonic acid
4) Surfactant: 0.05% FC 171 (3M Co)
5) Solvent: 94.97% propylene glycol monomethyl ether This ARC was spin coated onto a single crystal silicon substrate 100 mm in diameter, and baked on a vacuum hot plate at 205° C. for 60 seconds. The resulting thickness was 988 Å. Over this was coated a commercial DLIV positive photoresist, UVIIHS (Shipley Co.) to a thickness of 8620A after a vacuum hot plate baked at 140° C. for 60 seconds. It was exposed to KrF excimer radiation (248 nm) with an ISI XLS projection stepper through a mask patterned with small lines and spaces with a dose of 11.0 mJ/cm$^2$. The wafer was then baked on a vacuum hot plate at 140° C. for 90s, and then developed with CD26 (Shipley) developer for 50 seconds. Resist footing was measured by cross-section SEMs for both isolated and dense lines 0.25μm wide and averaged~4nm.

EXAMPLE 11

A further preferred antireflective composition was prepared by mixing the following components, with component amounts expressed as parts by weight based on total weight of the liquid antireflective composition:
1) Resin binder: 3.88% Polymer (novolac resin base with~4% glycidyl groups replacing OH, and ~45% of OH groups replaced by —O(C=O)CH$_2$—9-anthracene and 35% of OH groups replaced by COHCH$_2$O(C=O)CH$_3$+ ~7% residual 9-anthracene carboxylic acid)
2) Crosslinker: 1.02% Powderlink 1174 (American Cyanamid)
3) Acid: 0.10% p-toluene sulfonic acid
4) Surfactant: 0.05% FC 171 (3M Co)
5) Solvent: 94.97% propylene glycol monomethyl ether This ARC was spin coated onto a single crystal silicon substrate 100 mm in diameter, and baked on a vacuum hot plate at 205° C. for 60 seconds. The resulting thickness was 1095 Å. Over this was coated a commercial DUV positive photoresist, APEX-E (Shipley Co.) to a thickness of 8394 A after a vacuum hot plate baked at 90° C. for 60 seconds. It was exposed to KrF excimer radiation (248 um) with an ISI XLS projection stepper through a mask patterned with small lines and spaces with a dose of 8.6 mJ/cm$^2$. The wafer was then baked on a vacuum hot plate at 90° C. for 60s, and then developed with MF702 (Shipley) developer for 60 seconds. Resist footing was measured by cross-section SEMs for both isolated and dense lines 0.30 μm wide and averaged ~5 nm.

EXAMPLE 12

A further preferred antireflective composition was prepared by mixing the following components, with component amounts expressed as parts by weight based on total weight of the liquid antireflective composition: A solution containing:
1) Resin binder: 2.58% terpolymer of 9-anthrylmethylmethacrylate (24 mol %), 2-hydroxyethylmethacrylate (54 mol %) and methacrylic acid (22%)
2) Crosslinker: 0.38% Powderlink 1174 (American Cyanamid)
3) Thermal Acid Crosslinker: 0.038% benzoin tosylate
4) Surfactant: 0.003% FC431 (3M Co)
5) Solvent: 97% propylene glycol monomethyl ether This ARC was spin coated onto a single crystal silicon substrate 100 mm in diameter, and baked on a vacuum hot plate at 175° C. for 60 seconds. The resulting thickness was 595 Å. Over this was coated a commercial DUV positive photoresist, UVIIHS (Shipley Co.) to a thickness of 7950A after a vacuum hot plate baked at 135° C. for 60 seconds. It was exposed to KrF excimer radiation (248 nm) with an ISI XLS projection stepper. The wafer was then baked on a vacuum hot plate at 130° C. for 60 seconds, and then developed with CD26 (Shipley) developer for 50 seconds. Resist footing was measured by cross-section SEMs for both isolated and dense lines 0.25 μm wide and averaged ~19 nm.

EXAMPLE 13

A further preferred antireflective composition was prepared by mixing the following components, with component amounts expressed as parts by weight based on total weight of the liquid antireflective composition:
1) Resin binder: 3.58% copolymer: methylmethacrylate (39 mol %), 2-hydroxyethylnethacrylate (27%), methacrylic acid (7%) and butyl acrylate (27%)
2) Crosslinker: 1.0% Powderlink 1174 (American Cyanamid)
3) Thermal Acid Generator: 0.0185% 2-nitrobenzyltosylate
4) Surfactant: 0.002% Silwet L7001 (Union Carbide)
5) Solvent: 95% propylene glycol monomethyl ether This ARC was spin coated onto a single crystal silicon substrate 100 mm in diameter, and baked on a vacuum hot plate at 150° C. for 60 seconds. The resulting thickness was 1180 Å. Over this was coated a commercial DUV positive photoresist, APEX-E (Shipley Co.) to a thickness of 8400 Å after a vacuum hot plate baked at 90° C. for 60 seconds. It was exposed to KrF excimer radiation (248 mn) with an ISI XLS projection stepper through a mask patterned with small lines and spaces with a dose of 6.0 mJ/cm². The wafer was then baked on a vacuum hot plate at 90° C. for 90s, and then developed with MF321 (Shipley) developer for 60 seconds. Resist footing was measured by cross-section SEMs for both isolated and dense lines 0.30 μm wide and averaged 43 μm.

EXAMPLE 14

A further preferred antireflective composition was prepared by mixing the following components, with component amounts expressed as parts by weight based on total weight of the liquid antireflective composition:
1) Resin binder: 3.8% copolymer of 9-anthrylmethylmethacrylate (32 mol%) and 2-hydroxyethylmethacrylate (68 mol %)
2) Crosslinker: 1.0% Powderlink 1174 (American Cyanamid)
3) Thermal Acid Generator: 0.185% 2-nitrobenzyltosylate
4) Surfactant: 0.0015% FC431 (3M Co.)
5) Solvent: 95% propylene glycol monomethyl ether This ARC was spin coated onto a single crystal silicon substrate 100 mm in diameter, and baked on a vacuum hot plate at 150° C. for 60 seconds. The resulting thickness was 1077 Å. Over this was coated a commercial DUV positive photoresist, APEX-E (Shipley Co.) to a thickness of 8400 Å after a vacuum hot plate baked at 90° C. for 60 seconds. It was exposed to KrF excimer radiation (248 nm) with an ISI XLS projection stepper through a mask patterned with small lines and spaces with a dose of 7.3 'mJ/cm². The wafer was then baked on a vacuum hot plate at 90° C. for 90s, and then developed with MF321 (Shipley) developer for 60 seconds. Resist footing was measured by cross-section SEMs for both isolated and dense lines 0.30 μm wide and averaged 12 nm.

The foregoing description of the invention is merely illustrative thereof, and it is understood that variations and modifications can be effected without departing from the scope or spirit of the invention as set forth in the following claims.

What is claimed is:

1. An antireflective coating composition for use with an overcoated photoresist composition, the antireflective composition comprising a crosslinker and a resin binder comprises a polymer corresponding to the following formula:

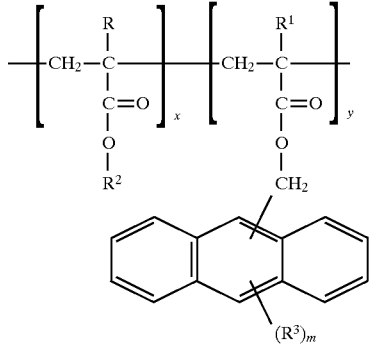

wherein each R and $R^1$ is independently hydrogen or a substituted or unsubstituted alkyl group having from 1 to about 8 carbon atoms;

each $R^2$ is independently substituted or unsubstituted alkyl having 1 to about 10 carbon atoms;

each $R^3$ is independently halogen, alkyl having 1 to about 8 carbon atoms, alkoxy having 1 to about 8 carbon atoms, alkenyl having 2 to about 8 carbon atoms, alkynyl having 2 to about 8 carbon atoms, cyano, or nitro;

m is an integer of from 0 to 9; and x is from about 10 to about 80 percent; and y is from about 5 to 90 percent.

2. The antireflective composition of claim 1 wherein $R^2$ is a hydroxyalkyl.

3. The antireflective composition of claim 1 wherein the sum of x and y is about 100 percent.

4. The antireflective composition of claim 1 wherein the crosslinker is a methoxy methylated glycouril.

5. The antireflective composition of claim 1 wherein the crosslinker compound has the following structure:

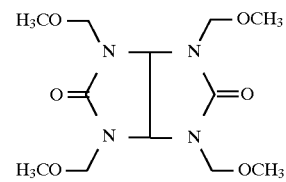

6. The antireflective composition of claim 1 wherein the crosslinker is a polyhydroxy compound.

7. The antireflective composition of claim 6 wherein the crosslinker is an aromatic compound with at least one hydroxy and at least one hydroxy alkyl substituent.

8. The antireflective composition of claim 1 further comprising an acid or acid generator compound.

9. An antireflective coating composition for use with an overcoated photoresist composition, the antireflective composition comprising a crosslinker and a resin binder comprises a polymer of the following structure:

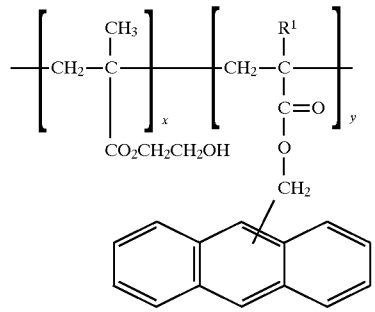

wherein x and y are mole fractions of the respective units.

* * * * *